United States Patent
Imai et al.

(10) Patent No.: US 7,795,592 B2
(45) Date of Patent: Sep. 14, 2010

(54) IMAGE DETECTOR AND MANUFACTURING METHOD OF THE SAME

(75) Inventors: Shinji Imai, Kanagawa-ken (JP); Shigeru Nakamura, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/602,205

(22) Filed: Nov. 21, 2006

(65) Prior Publication Data

US 2007/0114430 A1 May 24, 2007

(30) Foreign Application Priority Data

Nov. 21, 2005 (JP) ............... 2005-336298
Nov. 21, 2005 (JP) ............... 2005-336338

(51) Int. Cl.
*G01T 1/24* (2006.01)

(52) U.S. Cl. .............. 250/370.01; 250/336.1; 257/618

(58) Field of Classification Search ............ 250/370.01, 250/336.1
See application file for complete search history.

(56) References Cited

U.S. PATENT DOCUMENTS

| 4,849,296 | A | * | 7/1989 | Haluska et al. | 428/457 |
| 5,563,421 | A | * | 10/1996 | Lee et al. | 250/580 |
| 5,798,812 | A | * | 8/1998 | Nishiki et al. | 349/152 |
| 6,211,533 | B1 | * | 4/2001 | Byun et al. | 257/59 |
| 2003/0148019 | A1 | * | 8/2003 | Hwang et al. | 427/58 |
| 2005/0116240 | A1 | * | 6/2005 | Kim et al. | 257/88 |

FOREIGN PATENT DOCUMENTS

JP 2000-35480 A 2/2000
JP 2004-146769 A 5/2004

* cited by examiner

*Primary Examiner*—David P Porta
*Assistant Examiner*—Yara B Green
(74) *Attorney, Agent, or Firm*—Sughrue Mion, PLLC

(57) ABSTRACT

In an image detector that includes the following layers arranged on top of another: a charge generation layer that generates charges when exposed to a recording electromagnetic wave representing image information; and a charge detection layer that includes multitudes of detection elements disposed two-dimensionally, each having a switch element and a pixel electrode used for reading out the charges generated in the charge generation layer, a smoothing layer formed by a wet coating process is provided between the charge generation layer and charge detection layer.

15 Claims, 3 Drawing Sheets

IMAGE DETECTOR AND MANUFACTURING METHOD OF THE SAME

BACKGROUND OF THE INVENTION

1. Field of the Invention

The present invention relates to an image detector that includes the following layers arranged on top of another: a charge generation layer that generates charges when exposed to a recording electromagnetic wave representing image information, and a charge detection layer that includes multitudes of detection elements disposed two-dimensionally, each having a switch element and a pixel electrode used for reading out the charges generated in the charge generation layer. The present invention also relates to a manufacturing method of the image detector.

2. Description of the Related Art

Various types of radiation image detectors have been proposed and put into practical use in the medical field and the like. The radiation image detectors receive a recording electromagnetic wave transmitted through a subject to record the image information of the subject, and output electrical signals according to the recorded radiation image.

Among the radiation image detectors described above, various types of radiation image detectors using, for example, a semiconductor material that generates charges when exposed to radiation have been proposed. In the radiation detector, charges generated in the semiconductor material are accumulated, and image signals are outputted in accordance with the accumulated charges. As one of such radiation image detectors, a so-called TFT readout type radiation image detector is proposed as describe, for example, in Japanese Unexamined Patent Publication Nos. 2004-146769 and 2000-035480.

The TFT readout type radiation image detector includes an a-Se layer, which generates charges when exposed to radiation, provided on a TFT substrate. In this type of radiation image detector, charge injection is likely to occur from the pixel electrode on the TFT substrate to the a-Se layer, and thereby the image quality is degraded. Consequently, provision of an intermediate layer formed of an inorganic film is proposed, for example, in Japanese Unexamined Patent Publication No. 2004-146769 in order to prevent such image quality degradation.

The inorganic film described in Japanese Unexamined Patent Publication No. 2004-146769 is, however, formed by vacuum film forming, so that the inorganic film 90 is formed with the step of the edge portion of a pixel electrode 80 is reflected directly as shown in FIG. 7A. Accordingly, there may be a case in which the edge portion of the pixel electrode is not covered completely by the inorganic film 90, and image defects are caused by the leak current flowing from the edge portion to the a-Se layer 91 as shown in FIG. 7A. It may be possible to make the thickness of the inorganic film 90 sufficiently thick, but a film defect called a growth boundary line is developed at the edge portion of the pixel electrode 80, and complete blockage of the leak current is still difficult as shown in FIG. 7B.

In view of the circumstances described above, it is an object of the present invention to provide an image detector of the type described above capable of reducing leak current from the pixel electrode and image defects caused by the leak current. It is a further object of the present invention to provide a manufacturing method of the image detector.

SUMMARY OF THE INVENTION

The image detector of the present invention is an image detector that includes the following layers arranged on top of another: a charge generation layer that generates charges when exposed to a recording electromagnetic wave representing image information; and a charge detection layer that includes multitudes of detection elements disposed two-dimensionally, each having a switch element and a pixel electrode used for reading out the charges generated in the charge generation layer. Here, a smoothing layer formed by a wet coating process is provided between the charge generation layer and charge detection layer.

In the image detector of the present invention, the smoothing layer may be formed such that the inclination of a tilted face of the smoothing layer opposite to a side face of an edge portion of the pixel electrode with respect to the surface on which the pixel electrode is provided is smaller than the inclination of the side face with respect to the surface on which the pixel electrode is provided.

Further, the smoothing layer may be formed in such a manner as to satisfy Formula (1) below:

$$\theta 1/\theta 2 \leq 0.9 \quad (1)$$

where,

θ1 is equal to 90 degrees minus the inclination of the side face of the edge portion of the pixel electrode with respect to the surface on which the pixel electrode is provided, and θ2 is equal to 90 degrees minus the inclination of the tilted face of the smoothing layer.

Still further, the smoothing layer may be formed in such a manner as to satisfy Formula (2) below:

$$\theta 1/\theta 2 \leq 0.7 \quad (2)$$

Further, the smoothing layer may be formed in such a manner as to satisfy Formula (3) below:

$$\theta 2 \geq 50 \text{ degrees} \quad (3)$$

where,

θ2 is equal to 90 degrees minus the inclination of the tilted face of the smoothing layer.

Still further, the smoothing layer may be formed in such a manner as to satisfy Formula (4) below:

$$\theta 2 \geq 70 \text{ degrees} \quad (4)$$

Further, the smoothing layer may be formed of an inorganic film.

Still further, the smoothing layer may be formed of an organic film.

The manufacturing method of an image detector of the present invention is a manufacturing method of an image detector that includes the following layers arranged on top of another: a charge generation layer that generates charges when exposed to a recording electromagnetic wave representing image information; and a charge detection layer that includes multitudes of detection elements disposed two-dimensionally, each having a switch element and a pixel electrode used for reading out the charges generated in the charge generation layer. Here, a smoothing layer is formed by a wet coating process between the charge generation layer and charge detection layer.

In the manufacturing method of the present invention described above, the smoothing layer may be formed by an oxide film manufacturing method, in which a titanium oxide film or a zirconium oxide film is formed. The manufacturing method comprises the steps of: applying a precursor solution on a substrate, the precursor solution being composed of a solution of titanium alkoxide compound or a solution of zirconium alkoxide compound with added water of 0.8 to 3 times the titanium or zirconium in mole; exposing the substrate to a moisture environment; and drying the substrate by heating. Here, the solvent of the solution contains at least 40% of alkoxide alcohol by weight.

Further, the alkoxide alcohol may be either methoxyethanol or ethoxyethanol.

Still further, the titanium alkoxide compound may be any of tetraethoxy titanium, tetraisoproxy titanium, and tetrabutoxy titanium.

Further, the zirconium alkoxide compound may be any of tetraethoxy zirconium, tetraisoproxy zirconium, and tetrabutoxy zirconium.

Still further, the heating may be performed at a temperature of 150 to 400 degrees Celsius.

Here, the referent of "smoothing layer" as used herein means a layer for smoothing the steps and irregularities of the surface on which the smoothing layer is provided.

The image detector of the present invention includes the following layers arranged on top of another: a charge generation layer that generates charges when exposed to a recording electromagnetic wave representing image information; and a charge detection layer that includes multitudes of detection elements disposed two-dimensionally, each having a switch element and a pixel electrode used for reading out the charges generated in the charge generation layer. Here, a smoothing layer formed by a wet coating process is provided between the charge generation layer and charge detection layer. The wet coating process may avoid such a film defect as may be found in vacuum film forming, and may provide a defect-free film, so that the image detector of the present invention may reduce leak current from the pixel electrode and image defects caused by the leak current.

DESCRIPTION OF THE PREFERRED EMBODIMENTS

Figure 1:
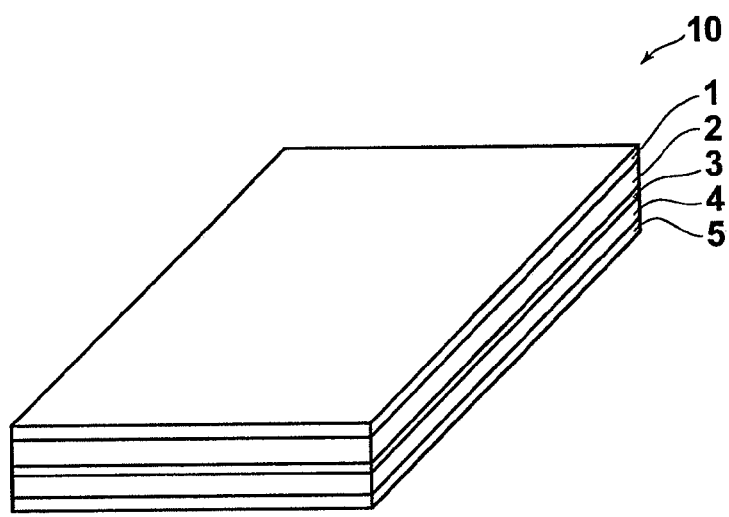
FIG. 1 is a perspective view of a radiation image detector that employs an embodiment of the image detector of the present invention.
Figure 2A:
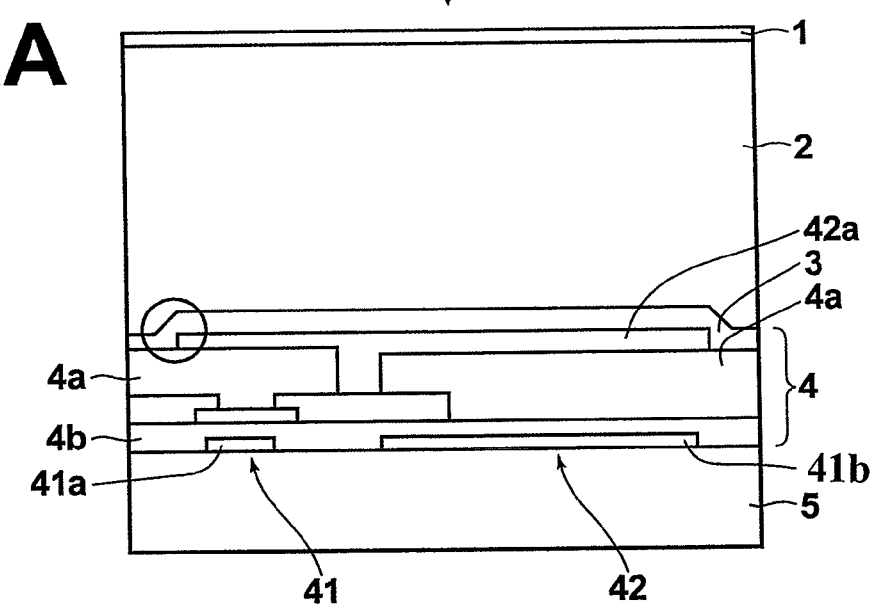
FIG. 2A is a partial cross-sectional view of the radiation image detector.

Hereinafter, a radiation image detector that employs an embodiment of the image detector of the present invention will be described with reference to accompanying drawings. FIG. 1 is a perspective view of the radiation image detector, illustrating the schematic structure thereof. FIG. 2A is a partial cross-sectional view of the radiation image detector.

As shown in FIG. 1, the radiation image detector 10 includes from top to bottom: an electrode layer 1; a photoconductive layer 2 that generates charges when exposed to radiation transmitted through the electrode layer 1; a smoothing layer 3; a charge detection layer that detects the charges generated in the photoconductive layer 2; and a glass substrate 5 from the top to bottom.

The electrode layer 1 may be formed of a metal such as ITO, Al, or Au.

The photoconductive layer may be made of any material as long as it is capable of generating charges when exposed to radiation, and a material consisting primarily of a-Se, which has superior characteristic including comparatively high quantum efficiency for radiation and high dark resistance, may be used.

Figure 3:
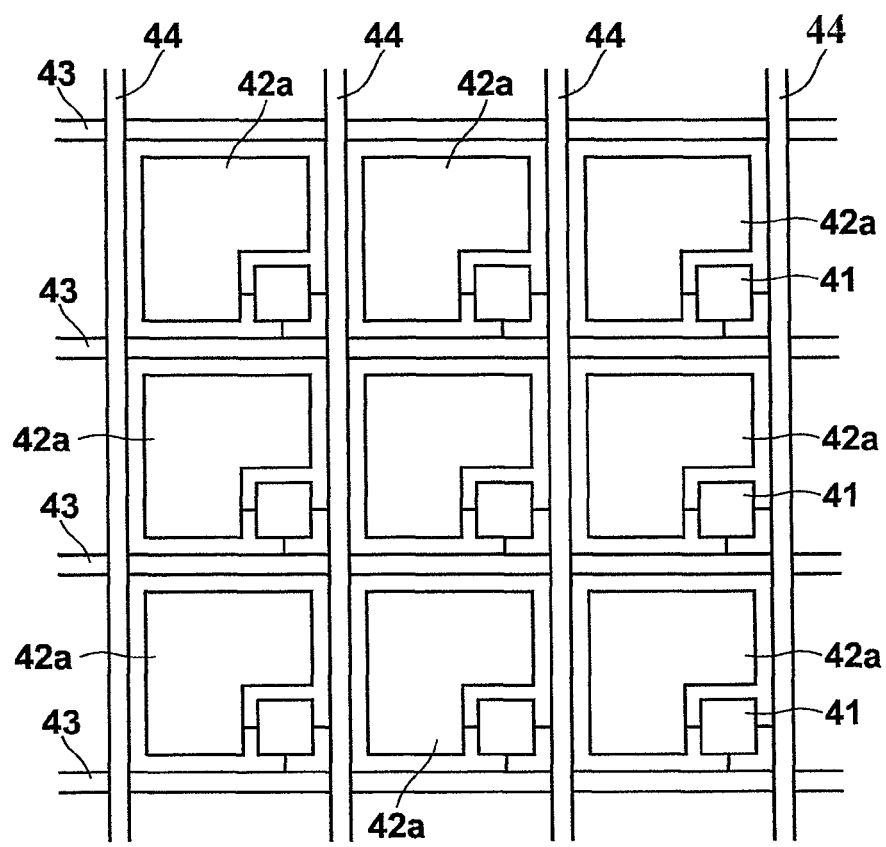
FIG. 3 is a top view of the radiation image detector.

The charge detection layer includes multitudes of detection elements, each having a TFT switch section 41 and a capacitor section 42, arranged two-dimensionally as shown in FIG. 2A. FIG. 3 illustrates the charge detection layer 4 viewed from the direction of arrow A in FIG. 2A. In FIG. 3, the electrode layer 1, photoconductive layer 2, and smoothing layer 3 are omitted for clarity. As shown in FIG. 3, the charge detection layer includes control lines 43 for passing control signals that control the switch sections 41, and signal lines 44 from which the charges accumulated in the capacitor sections 42 flow out. The reference numeral 4a indicates a dielectric layer, and the reference numeral 4b indicates an insulation layer. Further, the reference numeral 41a indicates the gate electrode of the TFT switch section 41 connected to the control line 43, and the reference numeral 41b indicates the lower electrode of the capacitor section 42 connected to the signal line 44.

The smoothing layer 3 is formed on the charge detection layer 4 by a wet coating process. For example, an organic film may be used as the material of the smoothing layer 3. More specifically, PVA (polyvinyl alcohol), PVP (polyvinyl pyrolidone), PAA (polyacrylic acid) or the like may be used. Further, any other material may also be used for the smoothing layer 3, as long as it has carrier selectivity, and is coatable by a wet coating process.

Figure 4:
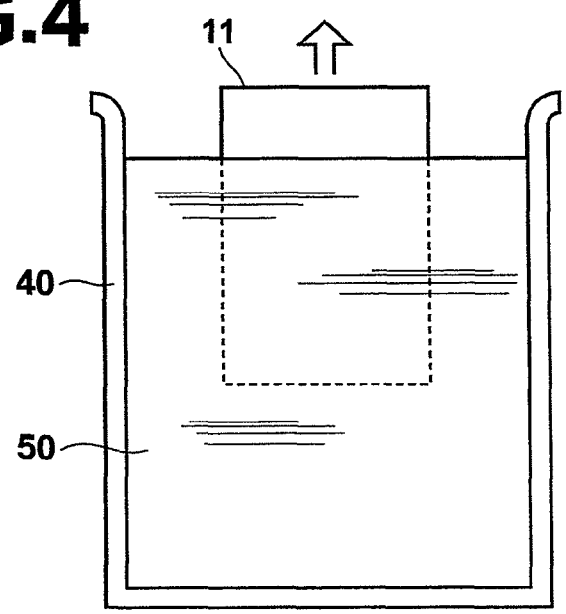
FIG. 4 is a drawing for explaining a manufacturing method of the radiation image detector.

The smoothing layer 3 may be formed by a wet coating process in the following manner. First, dissolving, for example, PVA 205 (produced by Kuraray Co., Ltd.) in a solvent of $H_2O$:ethanol=1:1 to provide a solution of 3% PVA. Then, as shown in FIG. 4, the solution 50 is put into the container 40, and dipping the TFT substrate 11 that includes a substrate 5 and a charge detection layer 4 formed thereon into the solution 50 and then pulling out of the solution.

The method of forming the smoothing layer is not limited to the wet coating process described above, and other wet coating processes may be used. For example, an organic film may be formed by a spin coating process or a spray coating process.

Figure 2B:
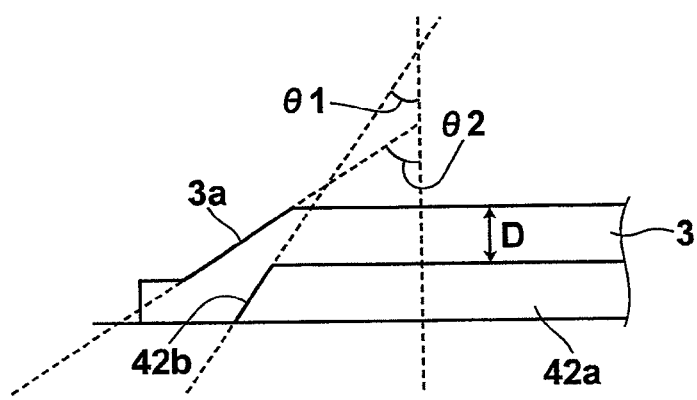
FIG. 2B is a partially enlarged view of FIG. 2A.

FIG. 2B illustrates an enlarged view of the encircled portion shown in FIG. 2A.

Preferably, the smoothing layer 3 to be provided on the charge detection layer 4 is formed such that the inclination of a tilted face 3a of the smoothing layer 3 opposite to a side face 42b of an edge portion of the pixel electrode with respect to the surface on which the pixel electrode 42a is provided is smaller than the inclination of the side face 42b with respect to the surface on which the pixel electrode 42a is provided.

More specifically, the smoothing layer 3 is preferable to be formed such that the relationship between $\theta 1$ and $\theta 2$ shown in FIG. 2B satisfies Formula (1) below.

$$\theta 1/\theta 2 \leq 0.9 \qquad (1)$$

where:
θ1 is equal to 90 degrees minus the inclination of the side face 42b of the edge portion of the pixel electrode 42a with reference to the surface on which the pixel electrode 42a is provided.
θ2 is equal to 90 degrees minus the inclination of the tilted face 3a of the smoothing layer 3.

More preferably, the smoothing layer 3 is formed in such a manner so as to satisfy Formula (2) below.

$$\theta1/\theta2 \leq 0.5 \quad (2)$$

Further, it may be formed in such a manner so as to satisfy Formula (3) below.

$$\theta2 \geq 50 \text{ degrees} \quad (3)$$

More preferably, it is formed in such a manner so as to satisfy Formula (4) below.

$$\theta2 \geq 70 \text{ degrees} \quad (4)$$

Here, θ1 may be obtained, for example, by obtaining the average angle of the inclination of the side face 42b, and θ2 may be obtained, for example, by obtaining the average angle of the inclination of the tilted face 3a.

Preferably, the thickness D of the smoothing layer 3 provided on the upper surface of the pixel electrode 42a is not greater than 2 μm, and more preferably not greater than 0.5 μm. For example, it may be 0.2 μm. The thickness of the pixel electrode 42a may be, for example, 200 Å.

Further, the smoothing layer 3 is not limited to an organic film, and it may be formed by coating an inorganic film. More specifically, a titanium oxide film or a zirconium oxide film may be formed as the smoothing layer 3.

More specifically, the smoothing layer 3 may be formed by the following steps. Preparing a precursor solution composed of a solution of titanium alkoxide compound or a solution of zirconium alkoxide compound with added water of 0.8 to 3 times the titanium or zirconium in mole; dipping the TFT substrate 11 into the precursor solution to apply the precursor solution on the charge detection layer 4; exposing it to a moisture environment; and drying it by heating.

Preferably, the solvent of the solution of titanium alkoxide compound or the solution of zirconium alkoxide compound contains at least 40 percent of alkoxide alcohol by weight, and the alkoxide alcohol is either methoxyethanol or ethoxyethanol. If the proportion of alkoxide alcohol in the solvent is less than 40% by weight, the stability of the precursor solution is not secured, and deposition or turbidity may appear in the precursor solution. If the proportion of alkoxide alcohol in the solvent is greater than or equal to 40% by weight, the solvent of the solution of titanium alkoxide compound or the solution of zirconium alkoxide compound may be composed solely of alkoxide alcohol.

Preferably, the titanium alkoxide compound is any of tetraethoxy titanium, tetraisoproxy titanium, and tetrabutoxy titanium, and zirconium alkoxide compound is any of tetraethoxy zirconium, tetraisoproxy zirconium, and tetrabutoxy zirconium.

The precursor solution is composed of a solution of titanium alkoxide compound or a solution of zirconium alkoxide compound with added water of 0.8 to 3 times the titanium or zirconium in mole. If the added water is less than 0.8 times the titanium or zirconium in mole, when the substrate with the precursor solution applied thereon is heat treated, turbidity may appear on the film, and if the added water is greater than 3 times the titanium or zirconium in mole, solidification may be caused in the precursor solution.

Specific limitations on the moisture environment and exposure time are difficult to determine since they depend on each other. But, preferably, the moisture environment is formed of a temperature in the range of 20 to 80 degrees Celsius with a relative humidity of 30 to 80%, and the exposure time is one hour to one week depending on the temperature and humidity.

Preferably, the heating is performed at a temperature of 150 to 400 degrees Celsius. If the heating temperature is below 150 degrees Celsius, the organic component may not be removed. On the other hand, although it is possible to produce the smoothing layer 3 at a temperature over 400 degrees Celsius, but the materials of the substrate are limited, and not desirable from the view point of economical manufacturing.

Figure 5:
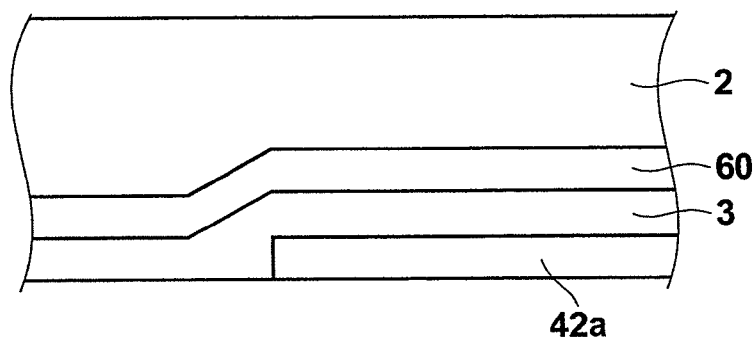
FIG. 5 is a partial cross-sectional view of the radiation image detector according to another embodiment.

In the embodiment described above, the smoothing layer 3 is formed of a material having carrier selectivity. But the material does not necessarily have carrier selectivity. For example, as shown in FIG. 5, the smoothing layer 3 is formed first on the pixel electrode 42a by a wet coating process using a material having moderate carrier mobility, such as PEDOT (polyethylene dioxythiophene) or the like. Then, a blocking layer 60 may be formed on the smoothing layer 3 using a material having carrier selectivity, such as $CeO_2$, or the like.

Figure 6:
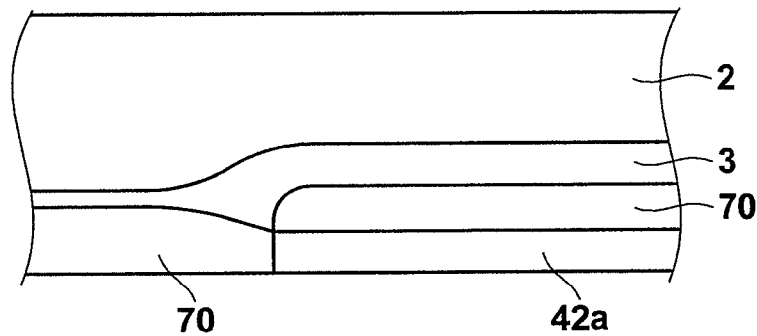
FIG. 6 is a partial cross-sectional view of the radiation image detector according to still another embodiment.
Figure 7A:
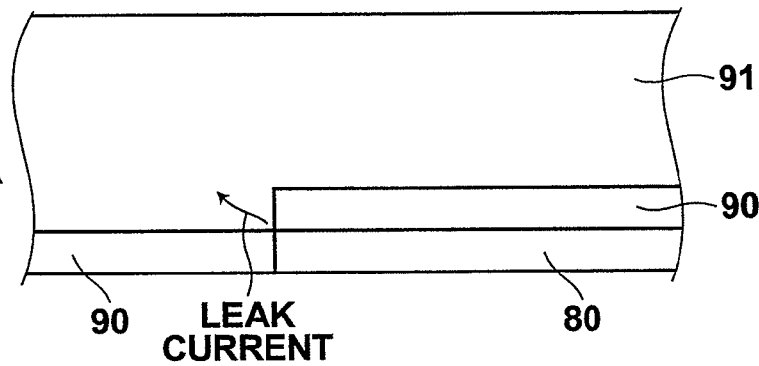
FIGS. 7A, 7B are drawings for explaining the conventional radiation image detector.
Figure 7B:
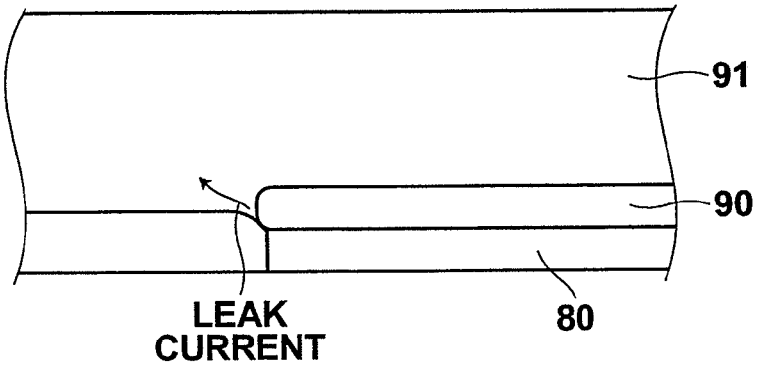

Further, in the embodiment described above, the smoothing layer 3 is provided directly on the pixel electrode 42a. Alternatively, for example, an inorganic film 70 is formed first on the pixel electrode 42a through vacuum deposition, and then the smoothing layer 3 may be formed on the inorganic film 70 through a wet coating process as shown in FIG. 6. Here, as for the inorganic material, for example, $CeO_2$ (thickness of 100 to 300 Å) may be used, and as for the material of the smoothing layer 3, a material having carrier selectivity may be used.

Examples of manufacturing methods of oxide films as the smoothing layer 3 will now be described.

Example 1

0.1 mole (28.4 g) of titanium tetrabutoxide was dissolved in 300 ml of ethoxyethanol. Then, 200 ml of isopropanol with water of 0.2 mole (3.6 ml) added in advance was added under high agitation for five minutes to obtain a transparent precursor solution. A glass substrate was dipped in the precursor solution and drew up at a rate of 8.4 mm/min, which was left in a moisture environment (35 degrees Celsius, 60%) for three days, and heated at 200 degrees Celsius for three hours. Thereby, a thin film of sample 1 was formed on the glass substrate. Similarly, samples 2 to 5 shown in Table 1 below were formed by replacing the entire or part of the solvent from ethoxyethanol to isopropanol. Table 1 summarizes the state of the precursor solutions and the formation state of thin films on the glass substrates.

TABLE 1

| | Sample | | | | |
|---|---|---|---|---|---|
| | 1 | 2 | 3 | 4 | 5 |
| Ethoxyethanol (%) | 0 | 20 | 40 | 60 | 100 |
| Isopropanol (%) | 100 | 80 | 60 | 40 | 0 |
| State of Precursor Solution | Deposition appears | Turbidity appears | Transparent | Transparent | Transparent |
| State of Thin Film | Not formed | Not formed | Transparent | Transparent | Transparent |

As Table 1 shows clearly, only when the ethoxyethanol accounts for greater than or equal to 40% of the solvent, a uniform precursor solution may be prepared, and the thin film formed of the precursor solution is a transparent thin film without turbidity and cracking. Further, the thin films of the samples 3 to 5 were scraped off to conduct heat analysis. The result shows that no weight loss is observed at temperatures up to 800 degrees Celsius. In addition, Fourier transform infrared absorption spectrum shows that the obtained thin film is formed of titanium oxide without any residual organic component.

Example 2

0.1 mole (38.4 g) of zirconium tetrabutoxide was dissolved in 300 ml of methoxyethanol. Then, 200 ml of methoxyethanol with water of 0.2 mole (3.6 ml) added in advance was added under high agitation for five minutes to obtain a transparent precursor solution. A glass substrate was dipped in the precursor solution and drew up at a rate of 8.4 mm/min, which was left in a moisture environment (40 degrees Celsius, 60%) for one day, and heated at 200 degrees Celsius for three hours. Thereby, a thin film of sample 9 was formed on the glass substrate. Similarly, samples 6 to 8, 11 and 12 shown in Table 2 below were formed by changing added amount of water. Table 2 summarizes the state of the precursor solutions and the formation state of thin films on the glass substrate.

TABLE 2

| | Sample | | | | | |
|---|---|---|---|---|---|---|
| | 6 | 7 | 8 | 9 | 10 | 11 |
| Water/Zirconium Tetrabutoxide (Mole Ratio) | 0 | 0.5 | 1.0 | 2.0 | 2.5 | 5.0 |
| State of Precursor Solution | Transparent | Transparent | Transparent | Transparent | Transparent | Solidify |
| State of Thin Film | Slightly turbid | Slightly turbid | Transparent | Transparent | Transparent | Transparent |

As Table 2 shows clearly, stable transparent solutions are obtained when the amount of added water is up to 2.5 times that of the zirconium tetrabutoxide, and if more amount of water is added thereto, then the solution becomes too unstable for the formation of thin films. That is, the solution solidifies in a short time or depositions are formed in the solution. On the other hand, if the amount of added water is less than or equal to 0.5 times that of the zirconium tetrabutoxide, turbidity is likely to appear in the obtained thin film which prevents a quality film to be produced. Further, the thin films of the samples 6 to 11 were scraped off to conduct heat analysis. The result shows that no weight loss is observed at temperatures up to 800 degrees Celsius. In addition, Fourier transform infrared absorption spectrum shows that the obtained thin film is formed of titanium oxide without any residual organic component.

Example 3

Samples 12 to 16 were prepared in the similar manner as the sample 4 in the Example 1 other than the heating temperature which was varied as in Table 3 below. The thin films were scraped off and weight losses were measured by a heating analyzer at temperatures up to 800 degrees Celsius to obtain the amount of residual organic components. As Table 3 shows clearly, an oxide film without any residual organic component may be obtained if heat treated at a temperature greater than or equal to 150 degrees Celsius.

TABLE 3

| | Sample | | | | |
|---|---|---|---|---|---|
| | 12 | 13 | 14 | 15 | 16 |
| Heating temperature (° C.) | 50 | 100 | 150 | 200 | 400 |
| Weight Loss (%) | 14 | 8 | <1 | <1 | <1 |

The manufacturing method of the smoothing layer 3 described above is a manufacturing method of a titanium oxide film or a zirconium oxide film, in which a precursor solution composed of a solution of titanium alkoxide compound or a solution of zirconium alkoxide compound with added water of 0.8 to 3 times the titanium or zirconium in mole is applied on a substrate, which is exposed in a moisture environment, and then dried by heating. Here, the solvent of the solution of titanium alkoxide compound or the solution of zirconium alkoxide compound includes at least 40% of alkoxide alcohol by weight, so that the stability of the precursor solution is ensured without requiring any additional stabilizer. Consequently, the formed film has no cracking, and does not become turbid. Thus, a uniform transparent film may be produced at a lower temperature, which allows wide selection of general purpose substrates. Further, a radiation image detector that includes a titanium oxide film or a zirconium oxide film, produced by the manufacturing method described above, as the intermediate layer may reduce image defects and suppress residual images without interrupting the electrical radiation image reading.

What is claimed is:

1. An image detector, comprising the following layers arranged on top of another:
    a charge generation layer that generates charges when exposed to a recording electromagnetic wave representing image information; and
    a charge detection layer that includes multitudes of detection elements disposed two-dimensionally, each having a switch element and a pixel electrode used for reading out the charges generated in the charge generation layer;
    wherein a smoothing layer formed by a wet coating process is provided between the charge generation layer and charge detection layer,
    wherein the smoothing layer is formed in such a manner as to satisfy Formula (1) below:

$$\theta_1/\theta_2 \leq 0.9 \qquad (1)$$

where, $\theta_1$ is equal to 90 degrees minus an inclination of a side face of an outer edge portion of the pixel electrode with respect to the surface on which the pixel electrode is provided, and
    $\theta_2$ is equal to 90 degrees minus an inclination of a tilted face of the smoothing layer,
    wherein the smoothing layer is a blocking layer that has carrier selectivity.

2. The image detector according to claim 1, wherein the smoothing layer is formed such that the inclination of a tilted face of the smoothing layer opposite to a side face of an edge portion of the pixel electrode with respect to the surface on which the pixel electrode is provided is smaller than the inclination of the side face with respect to the surface on which the pixel electrode is provided.

3. The image detector according to claim 2, wherein the smoothing layer is formed in such a manner as to satisfy Formula (3) below:

$$\theta 2 \geqq 50 \text{ degrees} \quad (3)$$

where, θ2 is equal to 90 degrees minus the inclination of the tilted face of the smoothing layer.

4. The image detector according to claim 3, wherein the smoothing layer is formed in such a manner as to satisfy Formula (4) below:

$$\theta 2 \geqq 70 \text{ degrees} \quad (4).$$

5. The image detector according to claim 1, wherein the smoothing layer is formed in such a manner as to satisfy Formula (2) below:

$$\theta 1/\theta 2 \leqq 0.7 \quad (2).$$

6. The image detector according to claim 1, wherein the smoothing layer is formed of an inorganic film.

7. The image detector according to claim 1, wherein the smoothing layer is formed of an organic film.

8. The image detector according to claim 1, wherein the smoothing layer is a layer for smoothing the steps and irregularities of the surface layer on which the smoothing layer is provided.

9. A manufacturing method of an image detector that includes the following layers arranged on top of another:
   a charge generation layer that generates charges when exposed to a recording electromagnetic wave representing image information; and
   a charge detection layer that includes multitudes of detection elements disposed two-dimensionally, each having a switch element and a pixel electrode used for reading out the charges generated in the charge generation layer,
   wherein a smoothing layer is formed by a wet coating process between the charge generation layer and charge detection layer,
   wherein the smoothing layer is formed in such a manner as to satisfy Formula (1) below:

$$\theta 1/\theta 2 \leqq 0.9 \quad (1)$$

where, θ1 is equal to 90 degrees minus an inclination of a side face of an outer edge portion of the pixel electrode with respect to the surface on which the pixel electrode is provided, and
θ2 is equal to 90 degrees minus an inclination of a tilted face of the smoothing layer,
wherein the smoothing layer is a blocking layer that has carrier selectivity.

10. The manufacturing method according to claim 9, wherein the smoothing layer is a layer for smoothing the steps and irregularities of the surface layer on which the smoothing layer is provided.

11. A manufacturing method of an image detector that includes the following layers arranged on top of another:
    a charge generation layer that generates charges when exposed to a recording electromagnetic wave representing image information; and
    a charge detection layer that includes multitudes of detection elements disposed two-dimensionally, each having a switch element and a pixel electrode used for reading out the charges generated in the charge generation layer,
    wherein a smoothing layer is formed by a wet coating process between the charge generation layer and charge detection layer,
    wherein:
    the smoothing layer is formed by an oxide film manufacturing method, in which a titanium oxide film or a zirconium oxide film is formed, the method comprising the steps of:
    applying a precursor solution on a substrate, the precursor solution being composed of a solution of titanium alkoxide compound or a solution of zirconium alkoxide compound with added water of 0.8 to 3 times the titanium or zirconium in mole;
    exposing the substrate to a moisture environment; and
    drying the substrate by heating; and
    the solvent of the solution contains at least 40% of alkoxide alcohol by weight.

12. The manufacturing method according to claim 11, wherein the alkoxide alcohol is either methoxyethanol or ethoxyethanol.

13. The manufacturing method according to claim 11, wherein the titanium alkoxide compound is any of tetraethoxy titanium, tetraisoproxy titanium, and tetrabutoxy titanium.

14. The manufacturing method according to claim 11, wherein the zirconium alkoxide compound is any of tetraethoxy zirconium, tetraisoproxy zirconium, and tetrabutoxy zirconium.

15. The manufacturing method according to claim 11, wherein the heating is performed at a temperature of 150 to 400 degrees Celsius.

* * * * *